United States Patent
Davidson et al.

(10) Patent No.: US 6,586,279 B1
(45) Date of Patent: Jul. 1, 2003

(54) METHOD OF INTEGRATING A HEAT SPREADER AND A SEMICONDUCTOR, AND PACKAGE FORMED THEREBY

(75) Inventors: Howard L. Davidson, San Carlos, CA (US); Richard Lytel, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/715,360

(22) Filed: Nov. 17, 2000

(51) Int. Cl.[7] ............................................... H01L 21/44
(52) U.S. Cl. ........................................ 438/122; 257/704
(58) Field of Search ................................. 438/122, 121, 438/758, 778, 785, 118, 119, 107, 108; 257/704, 712

(56) References Cited

U.S. PATENT DOCUMENTS

| | | | |
|---|---|---|---|
| 3,781,522 A | * 12/1973 | Borom et al. ............... 219/462 |
| 4,034,469 A | * 7/1977 | Koopman et al. .......... 174/16.3 |
| 4,450,471 A | * 5/1984 | Wellhoefer et al. ....... 228/123.1 |
| 5,200,641 A | 4/1993 | Kosaki ....................... 257/720 |
| 5,336,368 A | * 8/1994 | Iacovangelo et al. ....... 216/100 |
| 5,338,967 A | * 8/1994 | Kosaki ....................... 257/620 |
| 5,510,956 A | 4/1996 | Suzuki ....................... 361/704 |
| 5,631,046 A | * 5/1997 | Boudreaux et al. .......... 427/123 |
| 5,773,362 A | 6/1998 | Tonti et al. ................. 438/665 |
| 5,818,107 A | * 10/1998 | Pierson et al. .............. 257/686 |
| 5,869,883 A | * 2/1999 | Mehringer et al. ......... 257/667 |
| 5,956,576 A | * 9/1999 | Toy et al. ................... 257/704 |
| 5,981,310 A | * 11/1999 | DiGiacomo et al. ........ 438/106 |
| 5,998,238 A | 12/1999 | Kosaki ....................... 438/114 |
| 6,020,219 A | * 2/2000 | Dudderar et al. ........... 438/118 |
| 6,091,603 A | * 7/2000 | Daves et al. ................ 361/704 |
| 6,232,151 B1 | * 5/2001 | Ozmat et al. ............... 257/712 |
| 6,251,707 B1 | * 6/2001 | Bernier et al. .............. 438/118 |
| 6,300,167 B1 | * 10/2001 | Raleigh et al. ............. 438/121 |

FOREIGN PATENT DOCUMENTS

EP        0 194 475 A2    9/1986

* cited by examiner

Primary Examiner—David Nelms
Assistant Examiner—David Vu
(74) Attorney, Agent, or Firm—Pennie & Edmonds LLP

(57) ABSTRACT

A method of integrating a heat spreader into a semiconductor package includes depositing an adhesion metal layer on the back of a wafer at low temperature. A heat transfer metal layer is subsequently deposited on the adhesion metal layer at low temperature to form a heat spreader.

32 Claims, 4 Drawing Sheets

METHOD OF INTEGRATING A HEAT SPREADER AND A SEMICONDUCTOR, AND PACKAGE FORMED THEREBY

BRIEF DESCRIPTION OF THE INVENTION

This invention relates generally to the packaging of semiconductors. More particularly, this invention relates to a technique for integrating a semiconductor and a heat spreader for low thermal resistance and improved lateral heat transfer.

BACKGROUND OF THE INVENTION

It is becoming increasingly difficult to efficiently dissipate heat from semiconductors as the size and transistor density of semiconductors grow. It is known to use heat spreaders to remove heat from semiconductors. As used herein, the term heat spreader refers to a metallic element, such as a metallic slab, a contoured heat sink, and the like, used for heat transfer. The effectiveness of a heat spreader is contingent upon forming an efficient thermal joint with its associated semiconductor.

Epoxy is sometimes used between a semiconductor and a heat spreader. Unfortunately, epoxy results in relatively high thermal resistance. In addition, the epoxy provides practically no lateral heat dissipation. Lateral heat dissipation is becoming increasingly important as modern semiconductors experience large variances in heat flux across a semiconductor die. Lateral heat dissipation is required to transport heat from high heat flux density locations to low heat flux density locations.

To overcome the problems associated with epoxy, solder has been used to attach a heat spreader to a semiconductor. While solder provides relatively low thermal resistance compared to epoxy, there are a number of difficulties associated with its use. First, solder attachment requires high processing temperatures in the range of 150° C. to 350° C., depending upon the alloy. These relatively high temperatures can result in differential expansion between the heat spreader and the semiconductor. Therefore, when the high temperature attachment process is completed and the package is brought down to room temperature, the mismatch in coefficients of thermal expansion can produce a void between the heat spreader and the semiconductor. The high temperature attachment process associated with solder also requires special equipment to contain the molten solder. In addition, special equipment must be used to prevent the formation of native oxides at the inter-metallic joint.

Attempts have been made to form a heat spreader directly on a semiconductor. Unfortunately, attempts to directly deposit a metal on a semiconductor have resulted in poor adhesion. Thus, during temperature cycling, mismatches in the coefficients of thermal expansion between the heat spreader and the semiconductor have resulted in fracturing between the heat spreader and semiconductor. This problem is exacerbated as the size of a semiconductor increases.

In view of the foregoing, it would be highly desirable to provide an improved technique for integrating a semiconductor with a heat spreader for low thermal resistance and improved lateral heat transfer.

SUMMARY OF THE INVENTION

The invention includes a method of integrating a heat spreader into a semiconductor. The method includes depositing an adhesion metal layer on the back of a semiconductor at low temperature. A heat transfer metal layer is subsequently deposited on the adhesion metal layer at low temperature to form a heat spreader.

The invention also includes a semiconductor with an integrated heat spreader. The apparatus has a semiconductor with an active side and a passive side. An adhesion metal layer is attached to the passive side of the semiconductor. A heat transfer metal layer is positioned on the adhesion metal layer to form a heat spreader.

The technique of the invention provides atomic level bonding between the semiconductor and the adhesion metal. In turn, the heat transfer metal layer forms a tight bond with the adhesion metal. The heat spreader of the invention is deposited in a fully annealed condition, resulting in little intrinsic stress at the joint with the semiconductor. Thus, the heat spreader of the invention establishes a tight joint with its substrate to resist de-lamination and to facilitate heat transfer away from the semiconductor. The heat spreader of the invention facilitates extended lateral heat transfer with low thermal resistance. Therefore, excessive heat from high heat flux regions of a semiconductor is distributed to low heat flux regions of the semiconductor.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
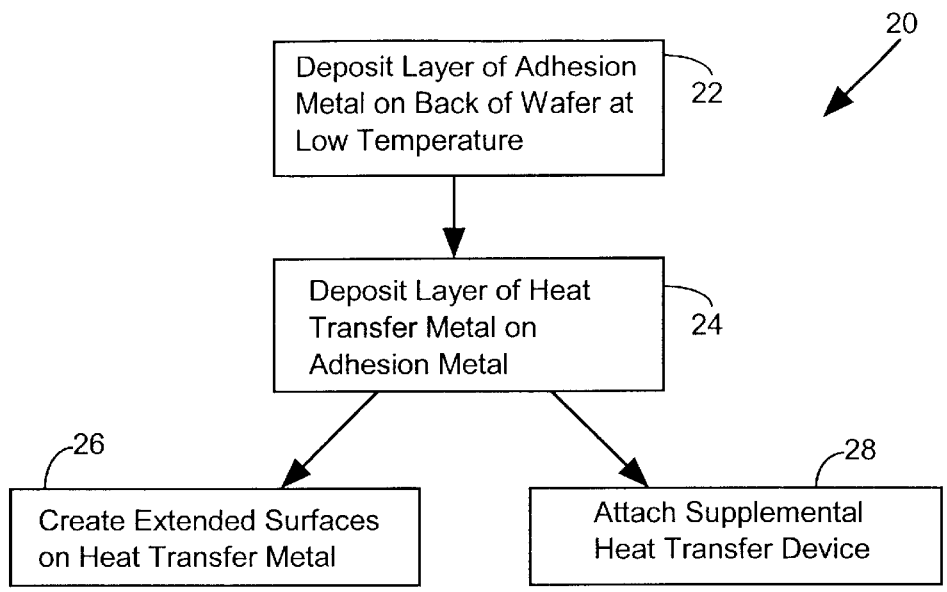
FIG. 1 illustrates processing steps performed in accordance with an embodiment of the invention.

FIG. 1 illustrates general processing steps performed in accordance with an embodiment of the invention. The process 20 includes an initial step of depositing a layer of adhesion metal on the back (passive or inactive side) of a semiconductor wafer at low temperature (step 22). The adhesion metal forms an inter-molecular bond with the semiconductor wafer.

This operation may be performed utilizing a number of techniques. For example, a reactive metal may be vacuum evaporated or sputtered onto the wafer. In particular, Chromium, Titanium, or Zirconium may be vacuum deposited in accordance with the invention. Alternately, a metal may be chemically deposited onto the wafer. For example, Copper, Silver, Nickel, Gold, or Tin may be chemically deposited onto the wafer using any number of well known techniques. In either embodiment, the process can be performed at a low temperature at or near room temperature (i.e., between approximately 15° C. and 35° C.). Thus, the metal is deposited in a fully annealed condition, leaving no intrinsic stress at the juncture with the semiconductor. In some implementations it is desirable to deposit the metal at a temperature corresponding to the operating temperature of the semiconductor. In such instances it is desirable to deposit the metal up to a temperature of approximately 100° C.

Next, a layer of heat transfer metal is deposited on the adhesion metal (step 24). For example, copper or silver, metals with extremely low thermal resistance may be deposited on the adhesion metal using electro-less or electro-plate techniques well known to those skilled in the art.

Thus, at this processing juncture, an adhesion metal layer is formed on the back of the semiconductor. The adhesion metal layer establishes a tight inter-molecular bond with the semiconductor. The heat transfer metal is formed on the adhesion metal layer. The heat transfer metal forms a tight inter-metallic bond with the adhesion metal layer, while providing extremely low thermal resistance for lateral heat transfer. Thus, the heat spreader of the invention provides a tight inter-molecular bond with the semiconductor, which is resistant to fracturing. Heat transfer to the heat spreader is facilitated by the inter-molecular bond. The heat transfer metal provides outstanding lateral heat transfer.

FIG. 1 illustrates optional processing steps that may be performed in accordance with an embodiment of the invention. In particular, the figure illustrates an optional step of creating extended surfaces on the heat transfer metal (step 26). The extended surfaces increase the amount of surface area associated with the heat spreader and thereby enhance heat transfer. For example, the extended surfaces may be in the form of heat sink fins or cooling channels. Extended surfaces may also be formed on the semiconductor prior to deposition of the adhesion metal layer in order to improve bonding and heat transfer between the semiconductor and the adhesion metal layer.

FIG. 1 also illustrates the optional processing step of attaching a supplemental heat transfer device to the heat spreader (step 28). As implied by its name, the supplemental heat transfer device is a device that supplements the heat transfer action of the heat spreader. By way of example, the supplemental heat transfer device may be a heat sink, a finned heat sink, a cold plate, a thermosiphon, a cover, a fan, and combinations thereof. The heat transfer metal layer 48 may be machined into a uniformly flat surface prior to attaching the supplemental heat transfer device. Advantageously, this machining operation does not damage the wafer 40. The formation of a uniformly flat surface is particularly important in the case of a large package, such as a multi-chip module.

Figure 2:
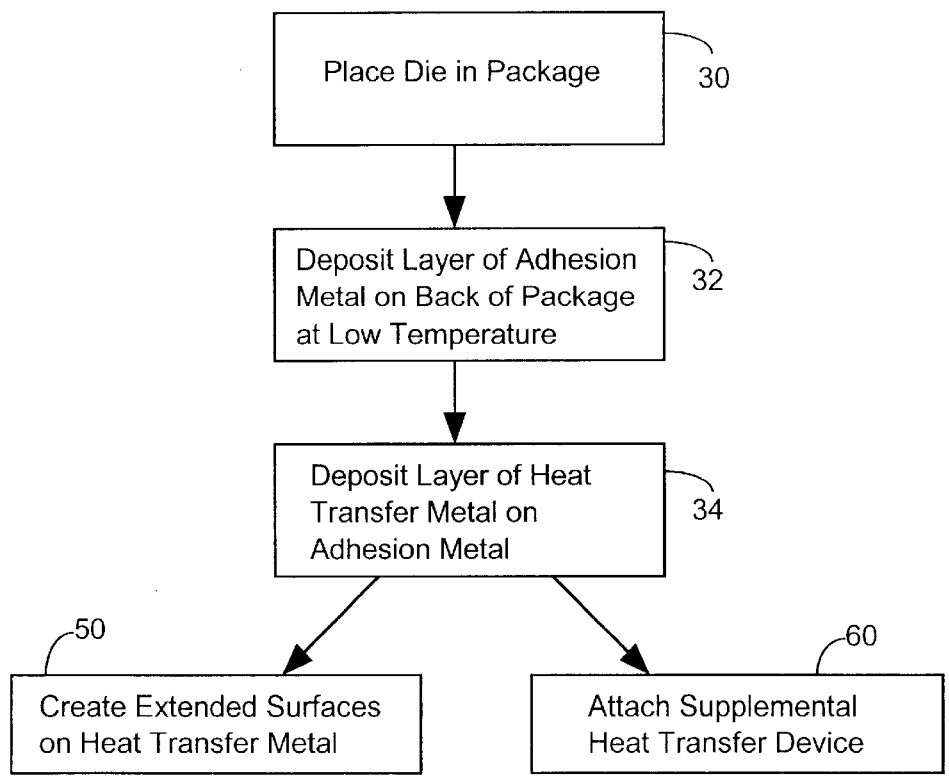
FIG. 2 illustrates processing steps for in-package processing performed in accordance with an embodiment of the invention.

FIG. 2 illustrates in-package processing steps performed in accordance with an embodiment of the invention. The first processing step of FIG. 2 is to place a die in or on a package (step 30). Next, a layer of adhesion metal is deposited on the back of the package at low temperature (step 32). This operation may be performed in accordance with the techniques discussed in connection with FIG. 1. However, observe in this instance that the metal is deposited on both the semiconductor and the package. Thus, the adhesion metal, in this embodiment, has the additional role of assisting in the formation of a hermetic package.

The next processing step of FIG. 2 is to deposit a layer of heat transfer metal on the adhesion metal (step 34). The techniques described in connection with step 24 of FIG. 1 may be used for this operation. This processing results in the apparatus of FIG. 3.

Figure 3:
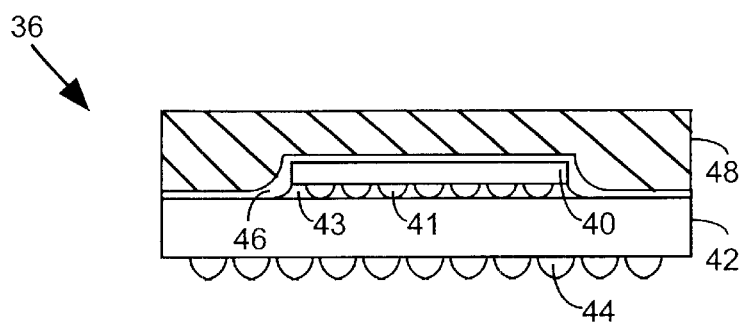
FIG. 3 illustrates a semiconductor package with an integral heat spreader formed in accordance with an embodiment of the invention.

FIG. 3 illustrates a semiconductor 40 positioned on a package 42. The semiconductor 40 is in a flip-chip configuration with a set of bond balls 41, which interface with bond pads of the package 42. As known in the art, a typical flip-chip is assembled by re-flowing solder balls 41 on the active side of the semiconductor 40. After this is completed, a polymer is dispensed between the semiconductor 40 and the package 42 to encapsulate the solder balls 41 and fill the void between the surface of the semiconductor 40 and the package 42. This encapsulating substance, known as an under-fill, is provided in sufficient volume to form a fillet 43 between the semiconductor 40 and the package 42. Observe that the adhesion metal 46 forms a hermetic seal over both the package 42 and the fillet 46.

The package 42 may be a ceramic or plastic package and includes a set of external connectors 44, which may be a ball grid array, package pins, or the like. Electrical traces (not shown for the sake of simplicity) link the external connectors 44 with the bond balls 41. FIG. 3 also illustrates a heat transfer metal layer 48 positioned over the adhesion metal layer 46.

Returning to FIG. 2, an optional operation of creating extended surfaces on the heat transfer metal (step 50) is illustrated. By way of example, FIG. 4 illustrates a heat transfer metal layer 48 with a set of ridges 49 forming an extended surface.

Figure 5:
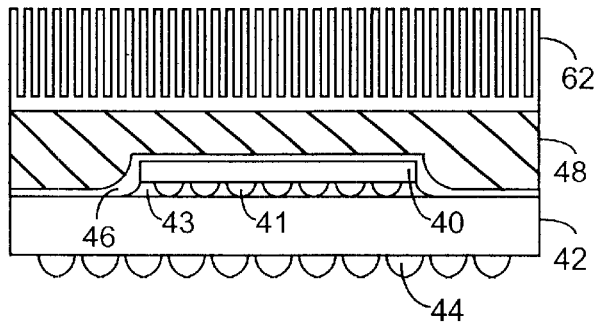
FIG. 5 illustrates an integral heat spreader of the invention utilized in connection with a supplemental heat transfer device, in this case, a finned heat sink.

FIG. 2 also illustrates an optional operation of attaching a supplemental heat transfer device to the heat transfer metal (step 60). FIG. 5 illustrates the results of this processing. In particular, the figure illustrates a heat transfer device 62 in the form of a finned heat sink attached to the heat transfer metal layer 48.

Figure 4:
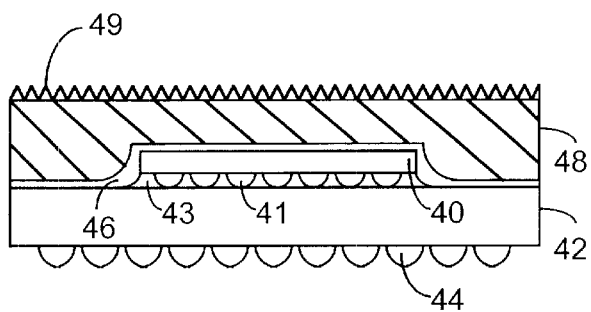
FIG. 4 illustrates a semiconductor package with an integral heat spreader that has an extended surface formed in accordance with an embodiment of the invention.

Observe that the packages of FIGS. 3–5 provide for extended lateral heat transfer. In other words, the heat spreaders formed in accordance with these embodiments are not limited to the dimensions of the semiconductors themselves, instead the dimensions laterally extend to the perimeters of the packages.

Figure 6:
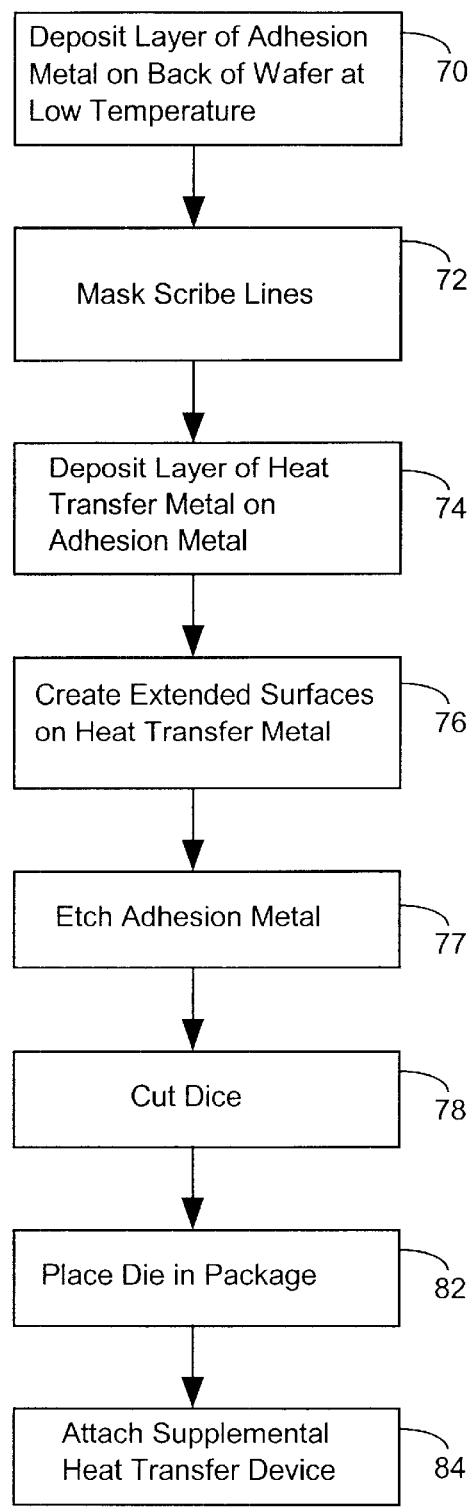
FIG. 6 illustrates processing steps for wafer scale processing performed in accordance with an embodiment of the invention.

FIG. 6 illustrates an embodiment of the invention performed at the wafer level. Thus, in this embodiment, the size of the heat spreader generally corresponds to the size of the die to which it is attached. The first processing step of FIG. 6 is to deposit a layer of adhesion metal on the back of a wafer at a low temperature (step 70). This is done using techniques of the type described above.

Afterwards, scribe lines are masked (step 72). That is, a mask is used to protect the scribe lines that will ultimately be used when cutting individual dice of the wafer.

Then, a layer of heat transfer metal is deposited on the adhesion metal (step 74) using techniques of the type described above. At this point, extended surfaces may optionally be formed in the heat transfer metal (step 76). Thereafter, the masked adhesion metal layer is etched (step 77). Then, individual dice of the wafer are cut (step 78).

Figure 7:
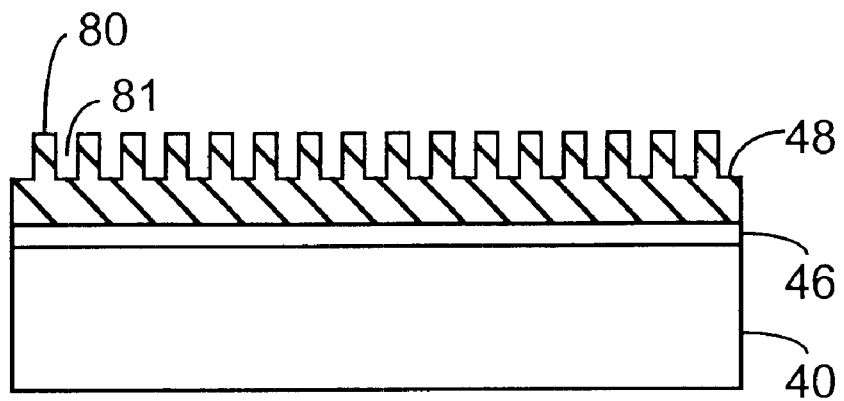
FIG. 7 illustrates a semiconductor with an integral heat spreader that has an extended surface formed in accordance with an embodiment of the invention.

FIG. 7 illustrates an individual die 40 with an adhesion metal layer 46 and a heat transfer metal layer 48. Observe in this embodiment that the heat spreader has a size corresponding to the size of the die, instead of a size corresponding to the size of the package, as is the case in the embodiments of FIGS. 3–5. FIG. 7 also illustrates that the heat transfer metal layer 48 has an extended surface in the form of a set of plateaus 80 and troughs 81. The troughs 81 may be used to transport a fluid. The semiconductor package of FIG. 7 is suitable for use in a flip-chip configuration.

Figure 8:
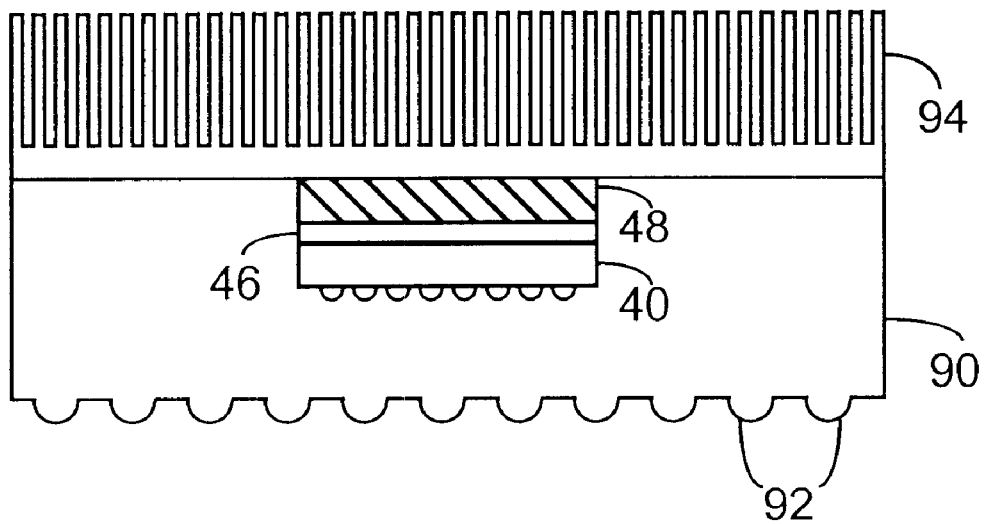
FIG. 8 illustrates, in accordance with an embodiment of the invention, a semiconductor with an integral heat spreader incorporated into a flip-chip package with a supplemental heat transfer device.

Returning to FIG. 6, the next processing step is to place one or more dice in a package (step 82). Optionally, a supplemental heat transfer device may then be attached to the package (step 84). FIG. 8 illustrates the result of this processing. In particular, FIG. 8 illustrates a housing 90, which may be a ceramic or plastic package. The housing 90 includes a well to receive the semiconductor 40. One or more semiconductors 40 may be positioned in the housing 90 to form a multi-chip module. FIG. 8 illustrates a ball grid array 92 to establish a flip-chip connection with a printed circuit board or other substrate. Although only one semiconductor 40 is shown in FIG. 8, multiple semiconductors may be positioned in the same housing 90. A supplemental heat transfer device in the form of a finned heat sink 94 is positioned on the housing 90.

Those skilled in the art will recognize a number of benefits associated with the invention. First, the invention provides an integral heat spreader and semiconductor that is formed without high temperature processing. The technique of the invention results in a tight intermolecular bond between the semiconductor and the adhesion metal layer. The heat transfer metal layer allows the use of copper or silver in a heat spreader without exposing the semiconductor to high temperature processing. Advantageously, the invention relies upon known processing equipment and techniques used in a new way to solve the problem of efficient heat removal from a semiconductor.

The foregoing description, for purposes of explanation, used specific nomenclature to provide a thorough understanding of the invention. However, it will be apparent to one skilled in the art that the specific details are not required in order to practice the invention. In other instances, well known devices are shown in block diagram form in order to avoid unnecessary distraction from the underlying invention. Thus, the foregoing descriptions of specific embodiments of the present invention are presented for purposes of illustration and description. They are not intended to be exhaustive of to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of integrating a heat spreader into a semiconductor, comprising:
   depositing an adhesion metal layer on the back of a semiconductor at a temperature of up to approximately 100° C.; and
   depositing a heat transfer metal layer on said adhesion metal layer to form a heat spreader.

2. The method of claim 1 wherein each depositing step is performed at a low temperature between 15° and 100° C.

3. The method of claim 2 wherein each depositing step is performed at a low temperature between 15° and 35° C.

4. The method of claim 1 wherein said depositing an adhesion metal layer includes depositing a reactive metal.

5. The method of claim 4 wherein said depositing an adhesion metal layer includes vacuum depositing a reactive metal.

6. The method of claim 4 wherein said depositing an adhesion metal layer includes sputtering a reactive metal.

7. The method of claim 4 wherein said depositing an adhesion metal layer includes depositing a reactive metal selected from the group consisting of: Chromium, Titanium, and Zirconium.

8. The method of claim 1 wherein said depositing an adhesion metal layer includes chemically depositing a metal selected from the group consisting of: Copper, Silver, Nickel, Tin, and Gold.

9. The method of claim 1 wherein said depositing a heat transfer metal layer includes depositing an electro-plated metal.

10. The method of claim 1 wherein said depositing a heat transfer metal layer includes depositing said heat transfer metal layer in an electro-less process.

11. The method of claim 1 wherein said depositing a heat transfer metal includes depositing a heat transfer metal selected from the group consisting of: copper and silver.

12. The method of claim 1 further comprising the step of forming an extended surface on said heat transfer metal layer.

13. The method of claim 1 further comprising the step of attaching a supplemental heat transfer device to said heat transfer metal layer.

14. The method of claim 13 wherein said attaching a supplemental heat transfer device to said heat transfer metal layer includes attaching a supplemental heat transfer device selected from the group consisting of: a heat sink, a finned heat sink, a cold plate, a thermosiphon, a cover, and a fan.

15. The method of claim 13 further comprising the step of machining said heat transfer metal layer prior to attaching said supplemental heat transfer device.

16. The method of claim 1, wherein the adhesion metal layer is deposited in a fully annealed condition onto the back of the semiconductor.

17. A method of integrating a heat spreader into a semiconductor, comprising:
   forming a tight inter-molecular bond between an adhesion metal layer and a back of a semiconductor at a temperature of up to approximately 100° C., to produce a low stress tight joint between said adhesion metal layer and said semiconductor; and
   forming an inter-metallic bond between a heat transfer metal layer and said adhesion metal layer to form a heat spreader.

18. The method of claim 17 wherein each forming step is performed at a low temperature between 15° and 100° C.

19. The method of claim 18 wherein each forming step is performed at a low temperature between 15° and 35° C.

20. The method of claim 17 wherein said forming of an adhesion metal layer includes depositing a reactive metal.

21. The method of claim 20 wherein said forming of an adhesion metal layer includes vacuum depositing a reactive metal.

22. The method of claim 20 wherein said forming of an adhesion metal layer includes sputtering a reactive metal.

23. The method of claim 20 wherein said forming of an adhesion metal layer includes depositing a reactive metal selected from the group consisting of: Chromium, Titanium, and Zirconium.

24. The method of claim 17 wherein said forming of an adhesion metal layer includes chemically depositing a metal selected from the group consisting of: Copper, Silver, Nickel, Tin, and Gold.

25. The method of claim 17 wherein said forming of a heat transfer metal layer includes depositing an electroplated metal.

26. The method of claim 17 wherein said forming of a heat transfer metal layer includes depositing said heat transfer metal layer in an electro-less process.

27. The method of claim 17 wherein said forming of a heat transfer metal includes depositing a heat transfer metal selected from the group consisting of: copper and silver.

28. The method of claim 17 further comprising the step of forming an extended surface on said heat transfer metal layer.

29. The method of claim 17 further comprising the step of attaching a supplemental heat transfer device to said heat transfer metal layer.

30. The method of claim 29 wherein said attaching a supplemental heat transfer device to said heat transfer metal layer includes attaching a supplemental heat transfer device selected from the group consisting of: a heat sink, a finned heat sink, a cold plate, a thermosiphon, a cover, and a fan.

31. The method of claim 29 further comprising the step of machining said heat transfer metal layer prior to attaching said supplemental heat transfer device.

32. The method of claim 17, wherein the adhesion metal layer is deposited in a fully annealed condition onto the back of the semiconductor.

* * * * *